(12) United States Patent
Ishida (10) Patent No.: US 10,640,385 B2
(45) Date of Patent: May 5, 2020

(54) CORE WIRE HOLDER AND METHOD FOR PRODUCING SILICON

(71) Applicant: TOKUYAMA CORPORATION, Yamaguchi (JP)

(72) Inventor: Haruyuki Ishida, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 305 days.

(21) Appl. No.: 15/523,919

(22) PCT Filed: Oct. 30, 2015

(86) PCT No.: PCT/JP2015/005490
§ 371 (c)(1),
(2) Date: May 2, 2017

(87) PCT Pub. No.: WO2016/072077
PCT Pub. Date: May 12, 2016

(65) Prior Publication Data
US 2017/0341944 A1    Nov. 30, 2017

(30) Foreign Application Priority Data
Nov. 4, 2014   (JP) ................. 2014-224058

(51) Int. Cl.
*C01B 33/035*     (2006.01)
*C23C 16/44*      (2006.01)
*C23C 16/24*      (2006.01)

(52) U.S. Cl.
CPC ............ *C01B 33/035* (2013.01); *C23C 16/24* (2013.01); *C23C 16/4418* (2013.01)

(58) Field of Classification Search
CPC ..... C01B 33/035; C23C 16/24; C23C 16/4418
See application file for complete search history.

(56) References Cited

U.S. PATENT DOCUMENTS 5,284,640 A * 2/1994 Jernegan ............... C01B 33/035
423/349
5,976,481 A   11/1999 Kubota et al.
(Continued)

FOREIGN PATENT DOCUMENTS

CN    102428028 A    4/2012
CN    102574691 B    7/2012
(Continued)

OTHER PUBLICATIONS

Basic Mechanical and Thermal Properties of Silicon; Virginia Semiconductor, Inc. R. Hull [ Properties of Crystalline Silicon (INSPEC, London, 1999)] (Year: 1999).*
(Continued)

Primary Examiner — Monica S Carter
Assistant Examiner — Mahdi H Nejad
(74) Attorney, Agent, or Firm — Maschoff Brennan (57) ABSTRACT

A core wire holder 3 attached on an electrode 2 placed on a bottom panel of a device 20 for producing silicon by Siemens process includes a silicon core wire holding portion 9 being generally circular truncated cone-shaped, and holding and energizing a silicon core wire 4. The silicon core wire holding portion 9 includes a generally circular truncated cone having an upper surface formed with a silicon core wire insertion hole 7 for holding the silicon core wire 4, and the silicon core wire holding portion 9 includes an upper surface and a side surface, which form a ridge having a curved surface and serving as a chamfered portion 8.

8 Claims, 7 Drawing Sheets

(56) References Cited

U.S. PATENT DOCUMENTS

| | | | |
|---|---|---|---|
| 8,366,892 B2 | 2/2013 | Kraus et al. | |
| 8,793,853 B2 * | 8/2014 | Netsu | C01B 33/035 29/244 |
| 9,150,420 B2 | 10/2015 | Kraus | |
| 2009/0297708 A1 * | 12/2009 | Tebakari | C01B 33/035 427/255.17 |
| 2011/0229658 A1 * | 9/2011 | Kraus | C01B 33/035 427/593 |
| 2012/0171845 A1 * | 7/2012 | Qin | C01B 33/035 438/478 |
| 2012/0175613 A1 * | 7/2012 | Netsu | C01B 33/037 257/49 |
| 2012/0186300 A1 | 7/2012 | Ishizaki et al. | |
| 2012/0201976 A1 | 8/2012 | Netsu et al. | |
| 2012/0222619 A1 * | 9/2012 | Netsu | C01B 32/225 118/723 R |
| 2017/0341944 A1 * | 11/2017 | Ishida | C01B 33/035 |
| 2020/0010327 A1 * | 1/2020 | Akiyoshi | C01B 33/035 |

FOREIGN PATENT DOCUMENTS

| | | |
|---|---|---|
| DE | 10 2009 021825 B3 | 8/2010 |
| DE | 102009021825 B3 | 8/2010 |
| EP | 2108619 A2 | 10/2009 |
| EP | 2138459 A1 | 12/2009 |
| EP | 2 368 848 A1 | 9/2011 |
| EP | 2368847 A1 | 9/2011 |
| EP | 2368848 A1 | 9/2011 |
| JP | 3357675 B2 | 12/2002 |
| JP | 201151837 A | 3/2011 |
| JP | 201184419 A | 4/2011 |
| JP | 2013203593 A | 10/2013 |
| WO | 2014168116 A1 | 10/2014 |

OTHER PUBLICATIONS

European Office Action issued in corresponding EP Application No. 15857430.1, dated Jan. 24, 2019.

Search Report of European Patent Application No. 15857430.1 dated Nov. 8, 2017.

* cited by examiner

Prior Art

CORE WIRE HOLDER AND METHOD FOR PRODUCING SILICON

TECHNICAL FIELD

The present invention relates to a novel core wire holder used for a device for producing silicon by Siemens process. The present invention also relates to a method for producing silicon with a core wire holder.

BACKGROUND ART

Typical methods proposed for producing polysilicon used as a raw material for a wafer for a semiconductor or photovoltaic power generation include a method for producing polysilicon called Siemens process. This Siemens process enables high purity polysilicon to be obtained, and is implemented as the most popular method for producing polysilicon.

Figure 8:
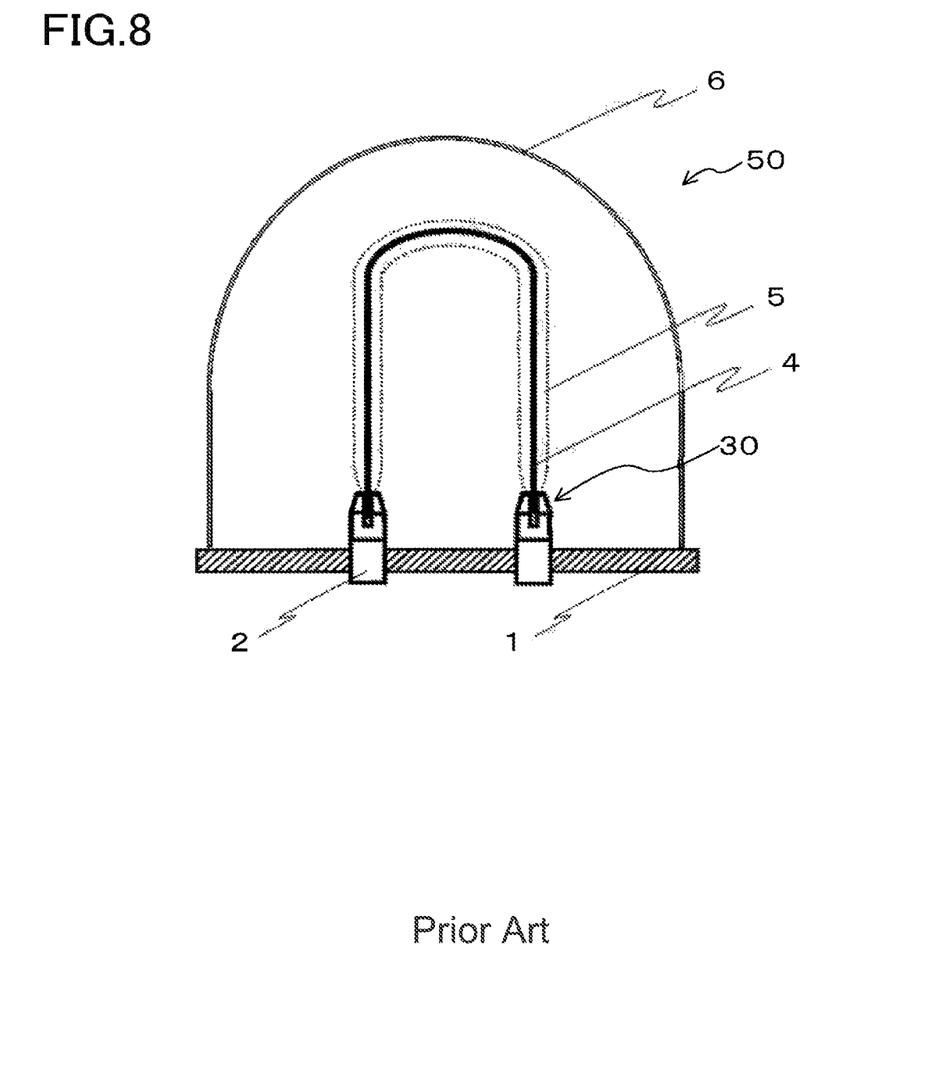
FIG. 8 is a schematic view showing a typical device for producing silicon by Siemens process.

FIG. 8 illustrates one example of a device for producing silicon by Siemens process. The device 50 for producing silicon includes a bottom panel 1 and a bell jar container 6. The bottom panel 1 is provided with metal electrodes 2 for energizing a silicon core wire 4, and the bell jar container 6 covers the bottom panel 1. In addition, a core wire holder 30 including an insertion hole for the silicon core wire 4 is fixed on the electrode 2 by, e.g., screws to hold and energize an end portion of the silicon core wire 4.

Then, in producing a polysilicon rod, both ends of the silicon core wire 4 formed in an inverted U shape are first fixed to the core wire holders 30. Next, the silicon core wire 4 is energized by the electrodes 2 through the core wire holders 30 and then heated to a silicon deposition temperature. Then, under this heat condition, silane compounds such as trichlorosilane or monosilane and reducing gas such as hydrogen are supplied into the reaction device to generate and deposit silicon on the silicon core wire 4, and then the silicon is collected as the silicon rod 5.

In addition, in recent years, in the method for producing the above polysilicon rod, some attempts have been made to produce a long silicon rod with a large diameter to obtain a large amount of silicon. Here, distortion and local load caused by expansion or shrinkage of such a large silicon rod increases at a silicon deposition stage or a cooling stage after the deposition. Thus, a leg portion of the silicon rod is broken (cracks appear), and consequently, destruction of the silicon rod 5 is caused.

One of the causes of the destruction of the silicon rod 5 is a stress generated, due to the cooling structure of the electrode 2, on the leg portion of the silicon rod 5, i.e., a contact portion between the silicon rod 5 (the silicon core wire 4) and the core wire holder 30.

More specifically, in the device 50 for producing silicon, the electrode 2 is generally made of metal such as SUS, copper, etc. To protect the electrode 2 from a high temperature atmosphere, provided is a cooling means (not shown) for water-cooling the inside of the device 50 for producing silicon. Consequently, the core wire holder 30 fixed to the electrode 2 is cooled, and also the temperature of the silicon core wire 4 inserted into the core wire holder 30 is reduced at the contact portion between the silicon core wire 4 and the core wire holder 30. Thus, in particular, when the silicon rod 5, which has been deposited by heating the silicon core wire 4 and is at a high temperature, is cooled and heat-shrinked immediately after the silicon deposition is completed, high stress is created in the contact portion between the silicon rod 5 and the core wire holder 30. Consequently, cracks appear in the core wire holder 30 or the silicon-deposited leg portion, and the destruction of the silicon rod 5 is caused To solve the above problem, a method for temporarily raising and then reducing the temperature of the silicon rod is suggested to reduce the distortion in the silicon rod that causes generation of the stress (see, e.g., Patent Document 1). Then, such a method can reduce generation of the distortion in the silicon rod.

However, in recent years, a silicon rod with a larger diameter has been developed. Thus, the amount of distortion and load increase, resulting in an increase in the stress on the leg portion of the silicon rod. Thus, it is difficult to effectively reduce the cracks in the leg portion of the silicon rod and the destruction caused thereby with the method of Patent Document 1 only.

To solve the above problem, a method for using a core wire holder provided with annular pleats is suggested, and the method includes forming a core wire holder having a partially thin outer wall to reduce heat transfer and using an air space between the pleats as heat insulating portion to reduce heat conduction from the electrodes (see, e.g., Patent Document 2).

CITATION LIST

Patent Document

PATENT DOCUMENT 1: Japanese Patent No. 3357675
PATENT DOCUMENT 2: Japanese Unexamined Patent Publication No. 2011-84419

SUMMARY OF THE INVENTION

Technical Problem

The method of Patent Document 2 adopts the core wire holder to reduce the growth of cracks in the leg portion. However, formation of the annular pleats makes the core wire holder itself partially thin, and consequently, this thin portion might have a decreased strength. In addition, a process of forming the annular pleats of the core wire holder might be complicated.

In view of the above problems, it is an object of the present invention to provide a low-cost and simple processing method for producing silicon using a device for producing silicon by Siemens process, and also provide a core wire holder with a simple structure allowing the core wire holder not to have a decreased strength, reducing stress in a contact portion between the core wire holder and a silicon core wire, reducing cracks in a leg portion of a silicon rod, and preventing destruction of the silicon rod.

Solution to the Problem

The inventors have conducted diligent studies to achieve the above object. Consequently, the inventors found that the core wire holder having a unique shape described below achieves the above object. Specifically, the typical core wire holder 30 includes a silicon core wire holding portion that was circular truncated cone-shaped and a base portion that was cylindrical-shaped as illustrated in FIG. 8, and the silicon core wire holding portion had a shape with an edge indicated by the dotted line in FIG. 2. Then, the inventors found the following and made the present invention. The contact portion located between the silicon core wire holding portion and the silicon rod and having a curved surface can reduce or disperse the stress generated when the silicon rod heated to a high temperature is cooled and heat-shrinked at the contact portion between the silicon core wire holding portion and the silicon rod, and being so large as to exceed a rupture strength of the silicon rod and cause destruction of the silicon rod. This can effectively reduce the cracks from the contact portion, and the object can be achieved.

More specifically, a core wire holder is attached on a metal electrode placed on a bottom panel of a device for producing silicon by Siemens process includes a silicon core wire holding portion. The silicon core wire holding portion is generally circular truncated cone-shaped, and is configured to hold and energize a silicon core wire. The silicon core wire holding portion includes a generally circular truncated cone having an upper surface formed with a silicon core wire insertion hole for holding the silicon core wire, and the silicon core wire holding portion includes a chamfered portion having a curved surface formed on a ridge formed by an upper surface and a side surface of the silicon core wire holding portion.

The core wire holder of the present invention may include a cylindrical-shaped or circular truncated cone-shaped base portion.

The core wire holder of the present invention may include the following configurations. A circular truncated cone in which the silicon core wire holding portion that is generally circular truncated cone-shaped is inscribed includes an upper surface in the shape of a circle with a diameter a and a bottom surface in the shape of a circle with a diameter b and has a height h. The silicon core wire holding portion includes the chamfered portion having the curved surface and having a radius R of curvature, and the relations a<b, a≤h≤15a, and a/10≤R≤2b are satisfied.

The core wire holder of the present invention may include the following configuration. A material for the core wire holder has a coefficient of thermal expansion at a ratio of 0.7-1.7, where a coefficient of thermal expansion of a silicon rod is 1.

The core wire holder of the present invention may include the following configuration. The core wire holder is made of carbon.

A method of the present invention for producing polysilicon by Siemens process includes using the core wire holder of the present invention, and depositing polysilicon on the silicon core wire.

Advantages of the Invention

In producing a polysilicon rod by a device for producing silicon by Siemens process, the constraining force generated by shrinkage of the silicon rod is dispersed at the contact portion between the silicon core wire holding portion and the silicon rod of the core wire holder of the present invention through a chamfered portion provided in the silicon core wire holding portion and having a curved surface when the silicon rod heated to a high temperature is cooled and heat-shrinked. Therefore, the stress generated at the contact portion can be reduced without decreasing the strength of the core wire holder. Accordingly, the stress can be effectively reduced to less than a rupture strength of the silicon, and generation of cracks in the leg portion of the silicon rod can be reduced.

Consequently, destruction of the silicon rod with a large diameter can be also effectively reduced.

In addition, the core wire holder of the present invention has a simple structure. For example, as described later, easy production can be done by forming a curved shape by grinding the ridge formed by the upper surface and the side surface of the silicon core wire holding portion of the typical core wire holder. This is industrially advantageous in terms of processing and costs.

DESCRIPTION OF EMBODIMENTS

A core wire holder of the present invention will be described below with reference to the drawings illustrating embodiments thereof. Note that the present invention is not limited to the following embodiments.

Figure 1:
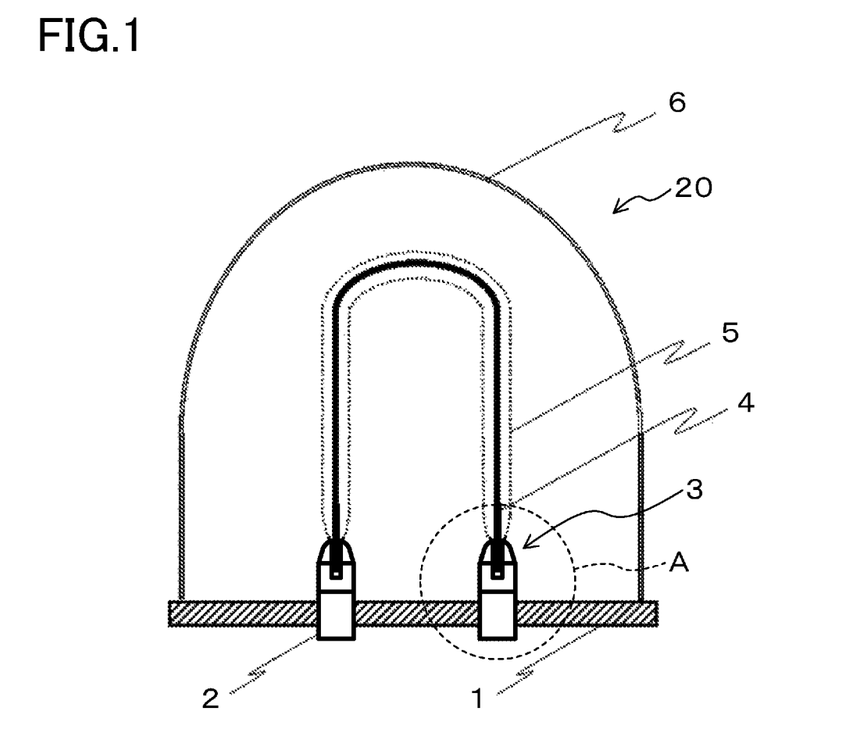
FIG. 1 is a schematic view showing a device of the present invention for producing silicon by Siemens process.
Figure 2:
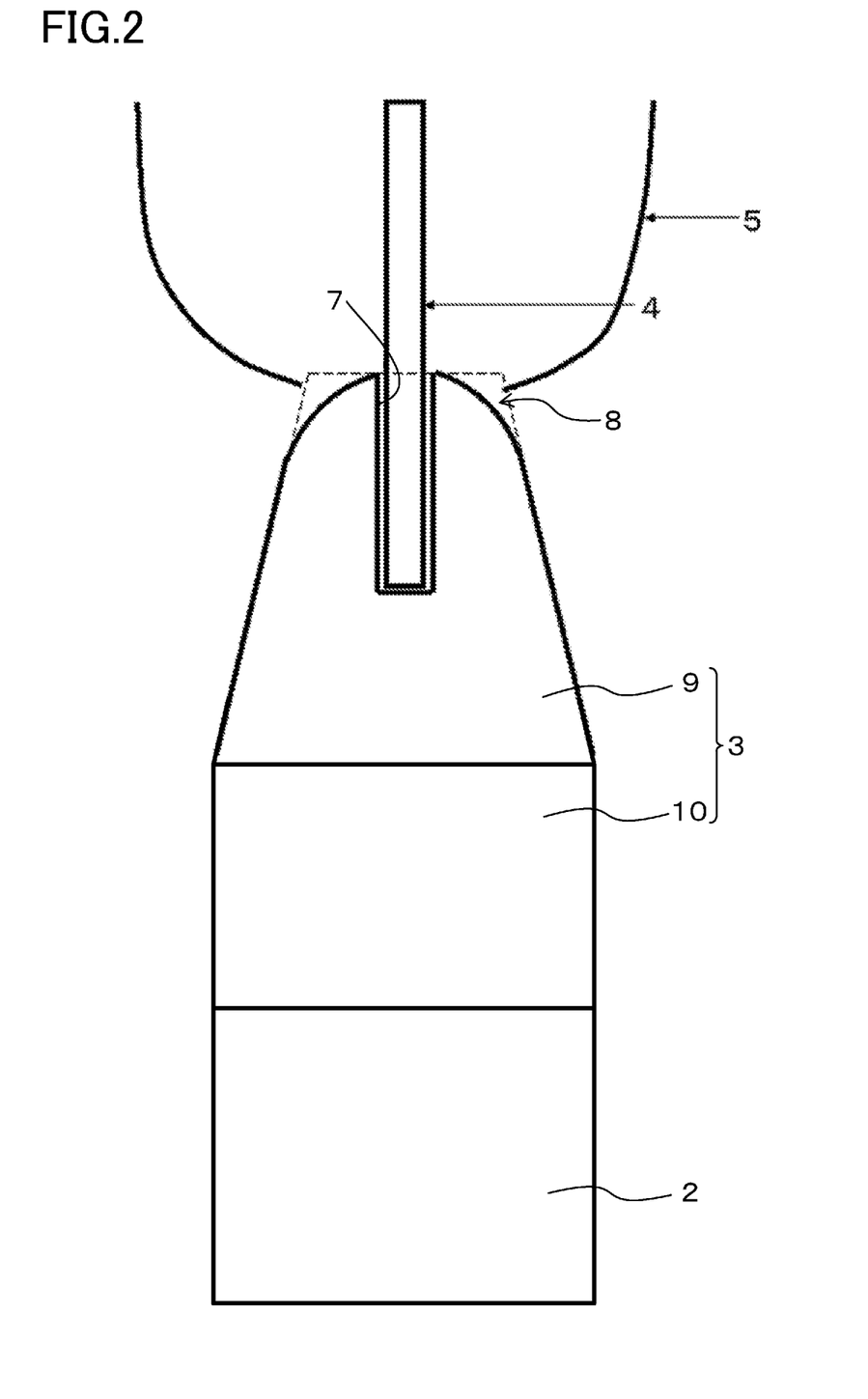
FIG. 2 is a schematic view showing one aspect of a core wire holder of the present invention and an enlarged view of the portion A of FIG. 1.
Figure 3:
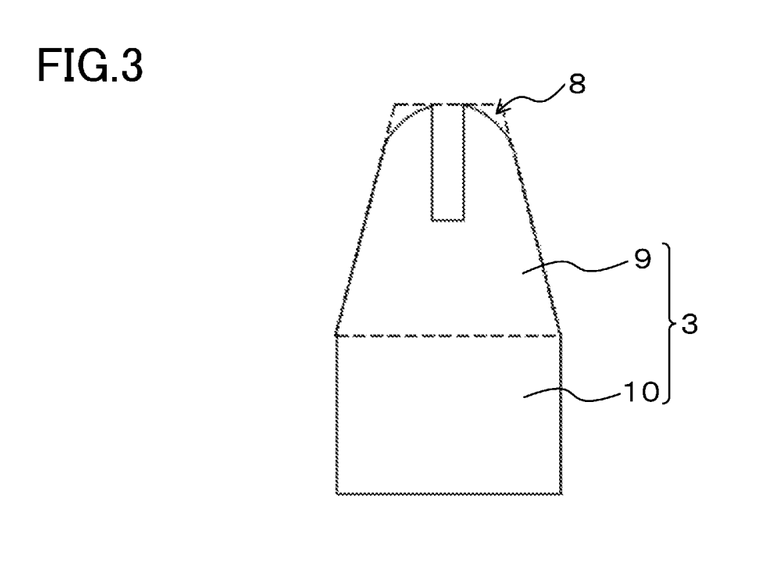
FIG. 3 is a schematic view showing one aspect of the core wire holder of the present invention.
Figure 4:
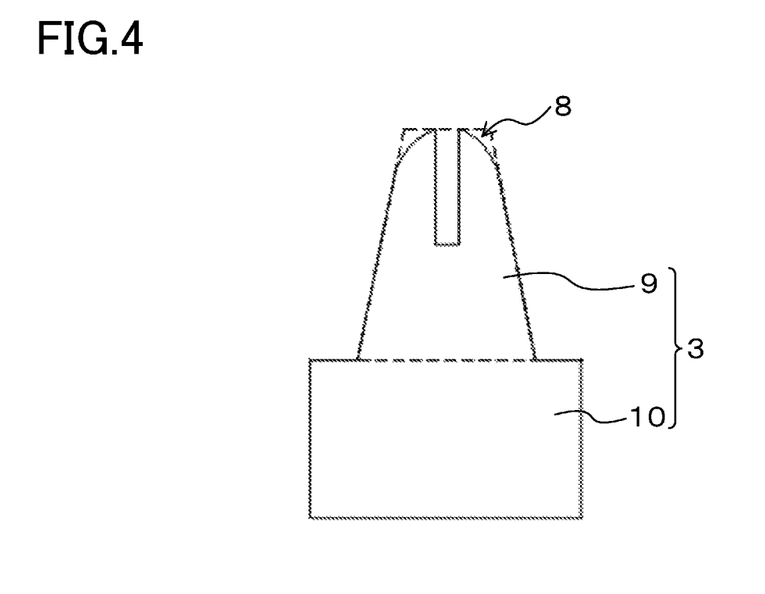
FIG. 4 is a schematic view showing one aspect of the core wire holder of the present invention.
Figure 5:
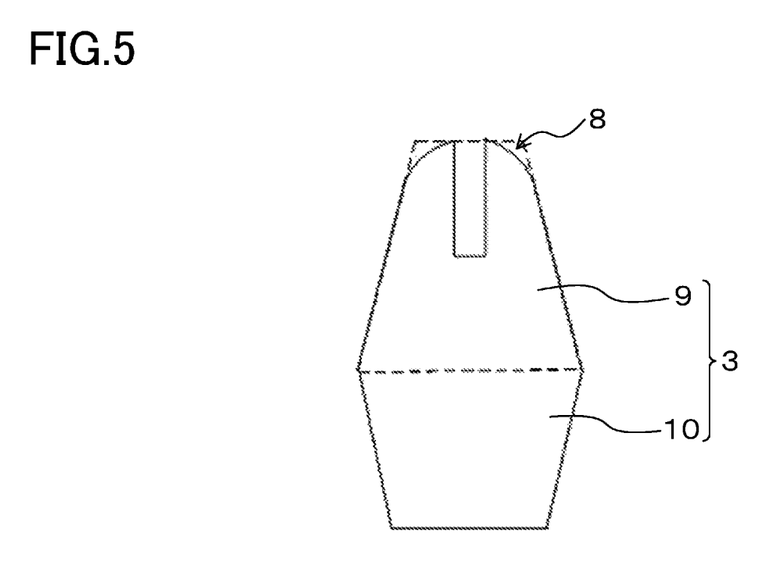
FIG. 5 is a schematic view showing one aspect of the core wire holder of the present invention.

FIG. 1 is a schematic view showing a device of the present invention for producing silicon by Siemens process. FIG. 2 is a schematic view showing one aspect of a core wire holder of the present invention, and is an enlarged view of the portion A of FIG. 1. FIGS. 3-5 are schematic views (cross-sectional views) each showing one aspect of a structure of the core wire holder of the present invention.

The device 20 of the present invention produces silicon by Siemens process. After preheat of the inside of a container 6 begins, the silicon core wire 4 is energized and a source gas for silicon deposition is supplied into the container 6, for polysilicon to be deposited on the silicon core wire 4.

As illustrated in FIG. 1, the device 20 for producing silicon includes a bottom panel 1 on which electrodes 2 are placed. Note that the device 20 of the present invention for producing silicon includes the container 6 containing at least one pair of the electrodes 2. In addition, the electrodes 2 are connected with both ends of the silicon core wire 4.

As illustrated in FIGS. 1 and 2, the device 20 for producing silicon also includes a core wire holder 3 attached on the electrode 2. The core wire holder 3 is used to hold and energize the silicon core wire 4.

As illustrated in FIG. 2, the core wire holder 3 of the present invention includes a silicon core wire holding portion 9 that is generally circular truncated cone-shaped. The silicon core wire holding portion 9 includes a generally circular truncated cone having an upper surface formed with a silicon core wire insertion hole 7 for holding the silicon core wire 4.

Here, as illustrated in FIG. 2, the silicon core wire holding portion 9 of the core wire holder 3 of the present invention includes a chamfered portion 8 having a curved surface formed on a ridge formed by an upper surface and a side surface of the silicon core wire holding portion 9.

Now suppose that a typical core wire holder was used and a silicon rod was obtained by heating a silicon core wire inserted into a silicon core wire insertion hole and depositing silicon on the silicon core wire. In particular, when the silicon rod at a high temperature was cooled immediately after the deposition was completed, a contact portion between a silicon core wire holding portion of the core wire holder and the silicon rod was constrained by heat shrinkage of the silicon rod. Then, high stress was created on the contact portion.

In contrast, the silicon core wire holding portion 9 of the core wire holder 3 of the present invention includes the chamfered portion 8 having a curved surface. Thus, the stress created does not concentrate on one portion but disperses. Accordingly, in a leg portion of the silicon rod 5, the stress is reduced to less than a rupture strength of the silicon. Also in the silicon rod 5 having a thick leg portion, cracks in the leg portion of the silicon rod 5 and destruction caused thereby can be effectively reduced.

The shapes except for the chamfered portion 8 of the silicon core wire holding portion 9 of the core wire holder 3 are not limited to particular shapes, and the shapes of publicly known core wire holders can be adopted.

In addition, the core wire holder 3 of the present invention preferably includes a cylindrical-shaped, circular truncated cone-shaped, or inverted circular truncated cone-shaped base portion 10 below the silicon core wire holding portion 9 that is generally circular truncated cone-shaped.

FIGS. 3-5 illustrate example core wire holders each including a base portion 10 that is cylindrical-shaped or inverted circular truncated cone-shaped. The most popular shape out of those base portions 10 is the one illustrated in FIG. 2, where the diameter of a bottom surface of the silicon core wire holding portion 9 that is generally circular truncated cone-shaped is equal to that of the upper surface of the base portion 10 that is cylindrical-shaped.

In addition, the core wire holder 3 includes the cylindrical-shaped or circular truncated cone-shaped base portion 10 and the generally circular truncated cone-shaped silicon core wire holding portion 9 that may be integrated, or may be detachably assembled and joined. In addition, the structure of this joint portion is not limited to particular structures as long as it is not broken by a load of the silicon rod and smooth energization is conducted, whereas examples of aspects of the structure include joints by the shapes such as a screw type, an engaging type, and a mortar type.

Next, the shape of the silicon core wire holding portion of the core wire holder of the present invention will be described in detail below.

Figure 6:
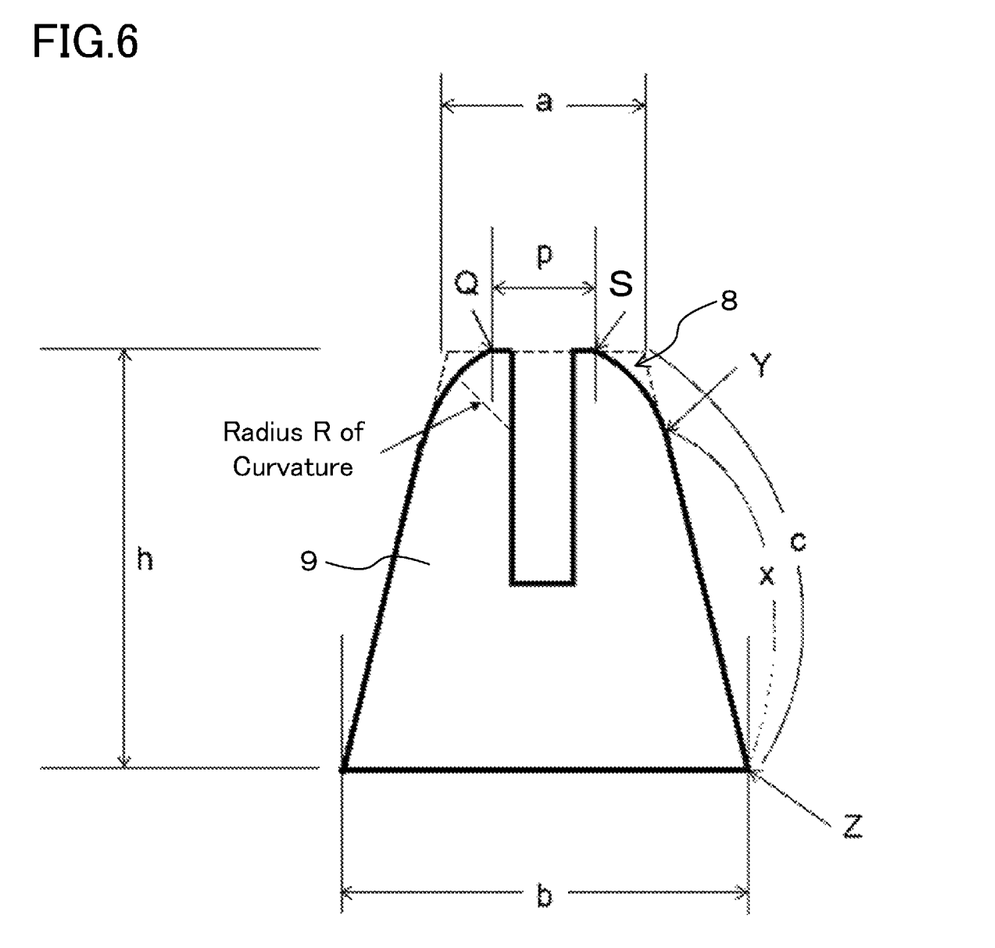
FIG. 6 is a schematic view showing one aspect of a silicon core wire holding portion of the core wire holder of the present invention.

FIG. 6 is a schematic view showing one aspect of the silicon core wire holding portion of the core wire holder of the present invention.

As illustrated in FIG. 6, the silicon core wire holding portion 9 of the present invention is generally circular truncated cone-shaped. Now suppose that the silicon core wire holding portion 9 is inscribed in the circular truncated cone including the upper surface in the shape of a circle with a diameter a and the bottom surface in the shape of a circle with a diameter b. Then, the relation a<b is satisfied.

Now suppose that the circular truncated cone has a height h as illustrated in FIG. 6. The height h preferably ranges in a≤h≤15a, and more preferably in 2a≤h≤10a. This is because, if the value of h is less than a, the silicon core wire holding portion 9 has a flat-shaped tip end portion, and thus might have difficulty in holding a grown silicon rod 5. In addition, if the value of h is larger than 15a, an increased amount of heat is transferred from the silicon core wire 4 to the silicon core wire holding portion 9, and thus the silicon core wire 4 is excessively cooled via the silicon core wire holding portion 9. This might prevent the silicon from growing on the base portion of the silicon core wire 4.

In addition, suppose that the chamfered portion 8 with the curved surface has a radius R of curvature. The curved surface may be configured to have a curved line having a single radius of curvature. In addition, if the curved surface is configured with a plurality of curved lines having different radiuses of curvature, the "radius R of curvature of the chamfered portion with the curved surface" means the radius of curvature of the entirety of the chamfered portion with the curved surface configured with the plurality of curved lines.

Note that, if the silicon core wire holding portion 9 includes the chamfered portion 8 having a single circumferential line as illustrated in FIG. 6, the "radius of curvature" means the radius of the single circumferential line. If the silicon core wire holding portion 9 includes the chamfered portion 8 having combination of a plurality of circumferential lines (four circumferential lines $L_1$-$L_4$) as illustrated in FIG. 7, the "radius of curvature" means all the radiuses corresponding to the respective circumferential lines $L_1$-$L_4$.

In addition, the radius R of curvature preferably ranges in a/10≤R≤2b, and more preferably in a/8≤R≤b. This is because, if the value of R is less than a/8, the chamfered portion 8 might have difficulty in having a curved surface. In addition, if the value of R is larger than b, the silicon core wire holding portion 9 might have difficulty in having a smoothly curved upper or side surface.

Figure 7:
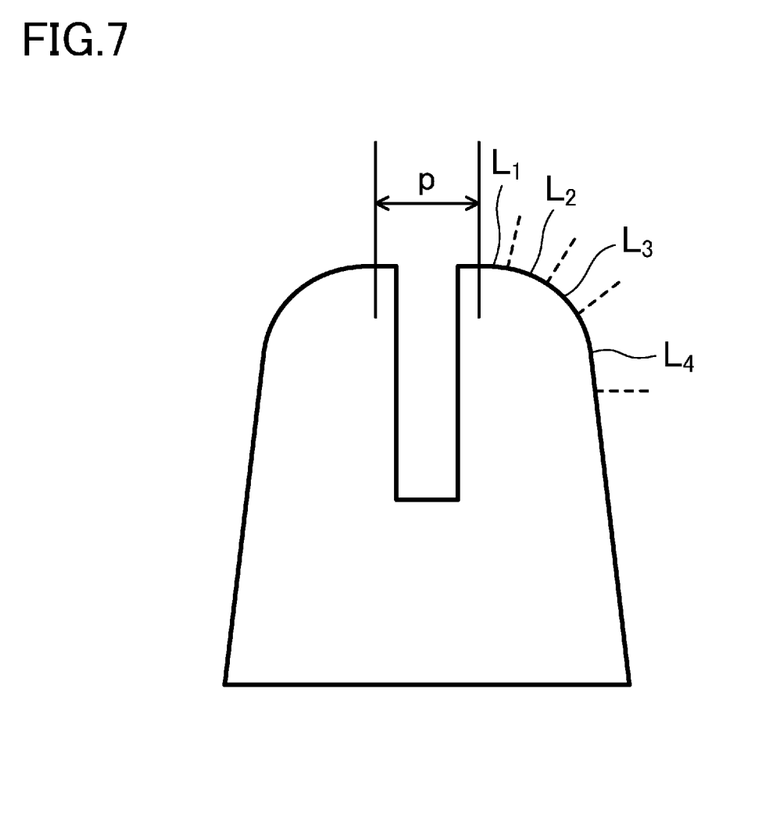
FIG. 7 is a schematic view for describing a radius of curvature of the silicon core wire holding portion of the core wire holder of the present invention.

Note that, if the silicon core wire holding portion 9 includes the chamfered portion 8 having combination of the plurality of circumferential lines $L_1$-$L_4$ as illustrated in FIG. 7, the smallest radius of curvature preferably ranges in a/10≤R, and the largest radius of curvature preferably ranges in R≤2b.

In addition, as illustrated in FIG. 6, suppose that the chamfered portion 8 has origins Q and S, and the line segment Q-S has a length p, where the origins Q and S are present in the radial direction of the upper surface of the circular truncated cone in which the silicon core wire holding portion 9 is inscribed. An optimum length p ranges depending on the size or shape of the entirety of the core wire holder 3, the size or shape of the silicon core wire holding portion 9, or the size of the silicon core wire insertion hole 7 formed on the upper surface of the silicon core wire holding portion 9. Thus, experiments are preferably conducted to determine an optimum range that allows the leg portion to grow sufficiently. In the present invention, the length p preferably ranges in 1/10a≤p≤9/10a, and more preferably in 1/5a≤p≤4/5a.

This is because, if the value of p is less than 1/5a, the silicon core wire holding portion 9 has a decreased strength, and thus might have difficulty in holding the silicon rod 5 grown. In addition, if the value of p is larger than 4/5a, an increased amount of heat is transferred from the silicon core wire 4 to the silicon core wire holding portion 9, and thus the silicon core wire 4 is excessively cooled via the silicon core wire holding portion 9. This might prevent the silicon from growing on the leg portion of the silicon core wire 4. Further, the ratio of the curved surface to the contact portion between the silicon rod 5 and the silicon core wire holding portion 9 is small, and thus the dispersion of the constraining force by heat shrinkage of the silicon rod 5 might decrease.

Now suppose that the circular truncated cone includes a side surface having a length c and having the chamfered portion with an origin Y, and a side line and a bottom line that meet at an intersection Z, as illustrated in FIG. 6. The line segment Y-Z has a length x, which preferably ranges in 1/10c≤x≤4/5c, and more preferably in 1/5c≤x≤2/3c.

This is because, if the range of x is less than 1/5c, silicon is unlikely to deposit on a tip end portion of the silicon core wire holding portion 9, which might have difficulty in holding the silicon rod 5 grown. In addition, if the range of x is larger than 2/3c, the ratio of the curved surface to the contact portion between the silicon rod 5 and the silicon core wire holding portion 9 is small, and thus dispersion of the constraining force by heat shrinkage of the silicon rod 5 might decrease.

In the present invention, a material for the core wire holder 3 is not limited to particular one as long as the material include an electrical conductivity required for the core wire holder 3. Note that, for industrial purposes, carbon is most preferably used.

In addition, a material for the core wire holder 3 has a coefficient of thermal expansion preferably at a ratio of 0.7-1.7, and more preferably at a ratio of 0.8-1.5, where the coefficient of thermal expansion of the silicon rod 5 is 1. This is because, if the coefficient of thermal expansion is out of this range, the constraining force by heat shrinkage in cooling the silicon rod 5 might increase.

Note that the "coefficient of thermal expansion" herein can be calculated from a value of a coefficient of linear expansion of an object measured with a thermo mechanical analysis (TMA) device. In recent times, a value of a coefficient of linear expansion of an object measured by a telemicro method with a laser is used for the calculation in some cases, and substantially the same value is obtained as the value measured by the thermo mechanical analysis device. Thus, the value measured by the telemicro method with a laser may be used for the calculation.

In addition, there are about 90-130 typical carbons (sintered compacts) used as materials for the core wire holder 3, and it is preferable to use a material having a coefficient of thermal expansion determined by multiplying the coefficient of thermal expansion of the silicon rod 5 by the above-described ratio. Specifically, if any of the above-described carbons is selected as a base material, the selected carbon may be either an isotropic material or an anisotropic material.

Here, in general, the "carbon" material is artificial graphite produced from a raw material such as natural lepidic graphite, petroleum coke, coal pitch coke, or carbon black. A molding article of this carbon material can be obtained by crushing a raw material, adjusting a particle size of the crushed material, mixing a binder such as coal tar or pitch with the crushed material, putting the resultant mixture into a mold, and compression-molding or extruding the mixture.

In this case, a material compression-molded by the hydrostatic molding method is referred to as an isotropic material, and a material pressed from one direction is referred to as an anisotropic material.

In addition, the anisotropic material has a coefficient of thermal expansion at a ratio of which the maximum value ranges preferably in 0.7-1.7.

In the present invention, the method for forming the chamfered portion 8 with a curved surface on the ridge formed by the upper surface and the side surface of the silicon core wire holding portion 9 is not limited to a particular method, and any methods publicly known can be adopted without any limitation. Specifically, if the base material for the silicon core wire holding portion 9 is carbon, the chamfered portion 8 is formed preferably by cutting. In addition, the core wire holder 3 of the present invention can be made by processing a ridge formed by an upper surface and a side surface of a typical silicon core wire holding portion that is circular truncated cone-shaped as illustrated in FIG. 8.

In the present invention, the core wire holder 3 may have any size enough to hold the silicon rod 5 in consideration of the diameter of the silicon rod 5, the load by the silicon rod 5, etc. after a silicon deposition reaction. In general, the silicon core wire holding portion 9 includes the bottom surface with the diameter b of 35 mm-60 mm and the height h of 50 mm-150 mm In addition, the silicon core wire insertion hole 7 of the core wire holder 3 may have any diameter and depth in consideration of the diameter of the silicon core wire 4 to be used, the expansion of the silicon core wire 4 under a high temperature during the silicon deposition reaction, and the load by the silicon rod 5.

In addition, the core wire holder 3 of the present invention is joined to the metal electrode 2. The structure of the joint portion is not limited to particular structures as long as smooth energization is conducted, whereas examples of aspects of the structure include joints by the shapes such as a screw type, an engaging type, and a mortar type.

Note that, to protect the components from a high temperature atmosphere, the electrode 2 usually has a structure enabling cooling by water-cooling etc., and is cooled during the silicon deposition as described above.

In the core wire holder 3 of the present invention, the silicon core wire 4 with the diameter of 5-12 mm is used, which is effective particularly in producing the silicon rod 5 with the diameter of 100 mm or more, particularly 120 mm or more.

EXAMPLES

The present invention will be described more specifically below with reference to examples. The present invention is not limited to these examples.

Examples 1-24

A core wire holder shown in FIG. 3 was used for calculation of a crack rate in a leg portion of a silicon rod after deposition. More specifically, a core wire holder including a silicon core wire holding portion and having a coefficient of thermal expansion shown in Table 1 was used for deposition of polysilicon on a silicon core wire having 8 mm per side and for production of a silicon rod having a diameter of about 150 mm. The silicon core wire holding portion had the lengths a, b, c, h, p, and x and the radius R of curvature shown in FIG. 6, and these lengths and the radius of curvature were set to the values shown in Table 1. Next, the crack rate in the leg portion of the silicon rod after deposition was calculated. The results are shown in Table 1.

Note that the evaluation was done based on the crack rate (N (%)) in the leg portion of the silicon rod determined by the mathematical expression (1) below.

(Mathematical Expression 1)

$N$ (%)=(the number of silicon rods having a leg portion with cracks at ejection)/(the total number of silicon rods)×100     (1)

TABLE 1

| Examples | a mm | b mm | c mm | h mm | R mm | p mm | x mm | Coefficient of Thermal Expansion Ratio to Silicon | N % |
|---|---|---|---|---|---|---|---|---|---|
| 1 | 40 | 60 | 100.5 | 100 | 5 | 10 | 15 | 1.3 | 2.0 |
| 2 | 40 | 60 | 100.5 | 100 | 5 | 10 | 30 | 1.3 | 0.5 |
| 3 | 40 | 60 | 100.5 | 100 | 5 | 10 | 70 | 1.3 | 0.5 |
| 4 | 40 | 60 | 100.5 | 100 | 5 | 10 | 85 | 1.3 | 1.0 |
| 5 | 40 | 60 | 100.5 | 100 | 5 | 10 | 97 | 1.3 | 5 |
| 6 | 40 | 60 | 100.5 | 100 | 5 | 5 | 80 | 1.3 | 3.5 |
| 7 | 40 | 60 | 100.5 | 100 | 5 | 30 | 80 | 1.3 | 3.5 |
| 8 | 25 | 60 | 62.5 | 60 | 5 | 5 | 45 | 1.3 | 1.5 |
| 9 | 25 | 60 | 62.5 | 60 | 5 | 10 | 45 | 1.3 | 1.0 |
| 10 | 25 | 60 | 62.5 | 60 | 5 | 15 | 45 | 1.3 | 1.0 |
| 11 | 25 | 60 | 62.5 | 60 | 5 | 10 | 45 | 1.3 | 1.5 |
| 12 | 25 | 60 | 62.5 | 60 | 10 | 10 | 45 | 1.3 | 0.5 |
| 13 | 25 | 60 | 62.5 | 60 | 15 | 10 | 45 | 1.3 | 0.5 |
| 14 | 25 | 60 | 62.5 | 60 | 20 | 10 | 45 | 1.3 | 1.0 |
| 15 | 25 | 60 | 62.5 | 60 | 15 | 10 | 45 | 0.8 | 2.5 |
| 16 | 25 | 60 | 62.5 | 60 | 15 | 10 | 45 | 1.6 | 3.5 |
| 17 | 15 | 40 | 19.5 | 15 | 8 | 10 | 10 | 1.3 | 1.0 |
| 18 | 15 | 40 | 32.5 | 30 | 5 | 12 | 15 | 1.3 | 0.5 |
| 19 | 15 | 40 | 61.3 | 60 | 5 | 10 | 25 | 1.3 | 0.5 |
| 20 | 15 | 40 | 100.8 | 100 | 5 | 10 | 40 | 1.3 | 0.5 |
| 21 | 15 | 40 | 150.5 | 150 | 5 | 10 | 100 | 1.3 | 1.0 |
| 22 | 15 | 40 | 100.8 | 100 | 5 | 10 | 80 | 1.3 | 1.0 |
| 23 | 15 | 40 | 51.5 | 50 | 5 | 10 | 30 | 1.3 | 1.0 |
| 24 | 15 | 80 | 41.0 | 25 | 8 | 10 | 25 | 1.3 | 5 |

Comparative Examples 1-3

A core wire holder shown in FIG. 3 was used for calculation of a crack rate in a leg portion of a silicon rod after deposition. More specifically, similarly to examples 1-24, a core wire holder including a silicon core wire holding portion and having a coefficient of thermal expansion shown in Table 2 was used for deposition of polysilicon on a silicon core wire having 8 mm per side and for production of a silicon rod having a diameter of about 150 mm. The silicon core wire holding portion had the lengths a, b, c, h, p, and x shown in FIG. 6, but included no chamfered portion with a curved surface on a ridge formed by an upper surface and a side surface of the silicon core wire holding portion. The lengths were set to the values shown in Table 1. Then, similarly to examples 1-24, the crack rate in the leg portion of the silicon rod after deposition was calculated. The results are shown in Table 2.

TABLE 2

| Comparative Examples | a mm | b mm | c mm | h mm | R mm | p mm | x mm | Coefficient of Thermal Expansion Ratio to Silicon | N % |
|---|---|---|---|---|---|---|---|---|---|
| 1 | 40 | 60 | 100.5 | 100 | — | — | 100.5 | 1.3 | >20 |
| 2 | 25 | 60 | 62.5 | 60 | — | — | 62.5 | 1.3 | >20 |
| 3 | 15 | 40 | 61.3 | 60 | — | — | 61.3 | 1.3 | >20 |

Tables 1 and 2 show the following. The core wire holders of examples 1-24 include the chamfered portion with the curved surface on the ridge formed by the upper surface and the side surface of the silicon core wire holding portion, and thus the stress is reduced to less than a rupture strength of the silicon. Consequently, the crack rate of in the leg portion of the silicon rod decreases where the cracks were typically generated at ejection of the silicon rod from the contact portion between the silicon rod and the silicon core wire holding portion.

DESCRIPTION OF REFERENCE CHARACTERS

1 Bottom Panel
2 Electrode
3 Core Wire Holder
4 Silicon Core Wire
5 Silicon Rod
6 Bell Jar Container
7 Silicon Core Wire Insertion Hole
8 Chamfered Portion
9 Silicon Core Wire Holding Portion
10 Base Portion

The invention claimed is:

1. A core wire holder attached on a metal electrode placed on a bottom panel of a device for producing silicon by Siemens process, the core wire holder comprising:
a silicon core wire holding portion being generally circular truncated cone-shaped, and configured to hold and energize a silicon core wire, wherein:
the silicon core wire holding portion is inscribed and includes a generally circular truncated cone having an upper surface formed with a silicon core wire insertion hole for holding the silicon core wire,
the circular truncated cone includes an upper surface in a shape of a first circle with a diameter "a",
the circular truncated cone includes a bottom surface in a shape of a second circle with a diameter "b", the circular truncated cone has a height "h", the silicon core wire holding portion includes a chamfered portion having a curved surface formed on a ridge formed by the upper surface and a side surface of the silicon core wire holding portion, the curved surface has a radius "R" of curvature, and "a", "b", "h", and "R" satisfy the following conditions: a<b, a≤h≤(15*a), and (a/10)≤R≤(2*b) such that a possibility in growth of cracking of a silicon rod formed by depositing polysilicon on the silicon core wire is reduced.

2. The core wire holder of claim 1, further comprising:
a cylindrical-shaped or circular truncated cone-shaped base portion.

3. The core wire holder of claim 1, wherein the core wire holder is made of carbon.

4. The core wire holder of claim 1, wherein a material for the core wire holder has a coefficient of thermal expansion at a ratio of 0.7-1.7, and wherein a coefficient of thermal expansion of the silicon rod is 1.

5. A method for producing polysilicon by Siemens process, comprising:
using the core wire holder of claim 1, and
depositing the polysilicon on the silicon core wire.

6. A method for producing polysilicon by Siemens process, comprising:
using the core wire holder of claim 2, and
depositing the polysilicon on the silicon core wire.

7. A method for producing polysilicon by Siemens process, comprising:
using the core wire holder of claim 3, and
depositing the polysilicon on the silicon core wire.

8. A method for producing polysilicon by Siemens process, comprising:
using the core wire holder of claim 4, and
depositing the polysilicon on the silicon core wire.

* * * * *